United States Patent [19]

Kato et al.

[11] Patent Number: 4,804,600
[45] Date of Patent: Feb. 14, 1989

[54] LITHOGRAPHIC MASK STRUCTURE AND PROCESS FOR PREPARING THE SAME

[75] Inventors: Hideo Kato; Hirofumi Shibatya, both of Yokohama; Keiko Matsuda, Tokyo, all of Japan

[73] Assignee: Canon Kabushiki Kaisha, Tokyo, Japan

[21] Appl. No.: 150,494

[22] Filed: Feb. 1, 1988

Related U.S. Application Data

[63] Continuation of Ser. No. 749,293, Jun. 27, 1985, abandoned.

[30] Foreign Application Priority Data

Jul. 6, 1984 [JP] Japan .................. 59-138878
Mar. 29, 1985 [JP] Japan .................. 60-65469

[51] Int. Cl.$^4$ .................. G03F 9/00; G21K 5/00
[52] U.S. Cl. .................. 430/5; 378/34; 378/35
[58] Field of Search .................. 430/5; 378/34, 35

[56] References Cited

U.S. PATENT DOCUMENTS

| | | | |
|---|---|---|---|
| 3,311,425 | 3/1967 | Schraub | 308/3 |
| 3,504,878 | 4/1970 | Dressler | 248/205 |
| 4,171,489 | 10/1979 | Adams et al. | 250/510 |
| 4,260,670 | 4/1981 | Burns | 430/5 |
| 4,454,209 | 6/1984 | Blais | 430/5 |
| 4,579,616 | 4/1986 | Windeschmann et al. | 156/160 |
| 4,677,042 | 6/1987 | Kato et al. | 430/5 |

FOREIGN PATENT DOCUMENTS 0182256 10/1983 Japan .

Primary Examiner—John E. Kittle
Assistant Examiner—P. J. Ryan
Attorney, Agent, or Firm—Fitzpatrick, Cella, Harper & Scinto

[57] ABSTRACT

There is disclosed a lithographic mask structure including a mask support film, and a support substrate, wherein the peripheral portion of the mask support film is attached on the surface of the support substrate which has a groove.

9 Claims, 3 Drawing Sheets

LITHOGRAPHIC MASK STRUCTURE AND PROCESS FOR PREPARING THE SAME

This application is a continuation of application Ser. No. 749,293 filed June 27, 1985, now abandoned.

BACKGROUND OF THE INVENTION

1. Field of the Invention

This invention relates to a mask structure for use in the lithographic processing technique and a process for preparing the same.

2. Description of the Prior Art

It has been widely utilized in the industry, particularly in the electronic industry, to produce various products by partially modifying the surfaces of workpieces according to a lithographic processing technique, which can mass-produce products having equally patterned, modified surface parts. Modification of workpiece surfaces is carried out by exposure to various energy beams, where an energy beam-shielding material is partially provided as a mask for forming a pattern. In the case that the energy beam to be irradiated is a visible light, glass, or a transparent substrate such as quartz, partially coated with a black light-shielding paint or partially provided with a visible light-nontransmissible thin sheet or film of such a metal as Ni or Cr, is used as a mask.

However, a fiber pattern formation and a lithographic processing technique for a shorter time have been recently in a keen demand, and thus X-ray, or particle beams such as ion beams, have been now utilized as an energy beam for irradiation. These energy beams are mostly absorbed by the glass plate or quartz plate used as a mask constituent member during the passage therethrough, as compared with the visible light. Thus, it is not preferable to use a glass plate or a quartz plate as a mask constituent member when these energy beams are used.

In the lithographic processing technique using X-ray or particle beams as an energy beam, various inorganic films, such as films of silicon nitride, boron nitride, silicon oxide, titanium, etc., or various organic films such as films of polyimide, polyamide, polyester, etc. or laminated films thereof are used as an energy-transmissible member, and a metal film such as films of gold, platinum, nickel, palladium, rhodium, or indium, is partially provided on the surface of said energy-transmissible member as an energy-absorbing member to prepare a mask. The mask itself is not self-supportable and thus must be supported on an appropriate support.

A lithographic mask structure has been so far prepared by forming a film comprising an X-ray-transmissible layer and a patterned X-ray-absorbing layer on a silicon wafer, and then removing the masked parts from the silicon wafer by etching. However, this process has many problems to be solved, particularly, in respect of the steps, time, and yield, for preparing the mask, which are the cause for delaying practical application of X-ray lithography.

FIG. 1 is a cross-sectional view of a conventional lithographic mask structure, and FIG. 2 is a plan view of its supporting substrate. Energy beam-absorbable mask members 3 are provided in a desired pattern on one side of energy beam-transmissible support film 2, and the peripheral part of the support film 2 is bonded to an annular support substrate 9 by an adhesive 8. No adhesive 8 is applied to the uppermost flat end surface 9a of annular support substrate 9 to improve the flatness, and the adhesive 8 is applied to the surface 9b which intersects at an angle $\theta$ with the flat end surface 9a at its outer peripheral side.

In the conventional mask structure as described above, the adhesive 8 extends not only between the support film 2 and the surface 9b, but also often over to the uppermost flat end surface 9a between the support film 2 and the annular support substrate 9. When the support substrate 9 is bonded to the support film 2. As a result, the flatness of support film 2 is often lowered. The lowering of the flatness leads to poor precision in the lithographic process.

SUMMARY OF THE INVENTION

One object of the present invention is to provide a process for preparing a lithographic mask structure rapidly through simplified steps with a high yield.

Another object of the present invention is to provide a process for preparing a mask structure by the so-called transfer technique, where the transfer is carried out simply with a high yield.

Another object of the present invention is to provide a lithographic mask structure having a support film with a distinguished flatness, prepared by bonding a mask member-supporting film to an improved annular support substrate.

A further object of the present invention is to provide a lithographic mask structure prepared by bonding the peripheral part of a mask member-supporting film for providing mask members in a desired pattern to a support substrate, wherein a groove is provided on the bonding surface of the support substrate.

Still a further object of the present invention is to provide a process for preparing a lithographic mask structure by forming a mask film member provided with mask members on a flat plate, and bonding and transferring the film member to a support substrate, wherein a groove is provided at the bonding position of the support substrate to the film member, thereby controlling flow of an adhesive agent for the film member.

DETAILED DESCRIPTION OF PREFERRED EMBODIMENTS

Figure 1:
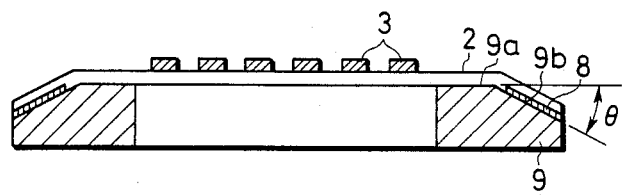
FIG. 1 is a cross-sectional view of a conventional lithographic mask structure.
Figure 2:
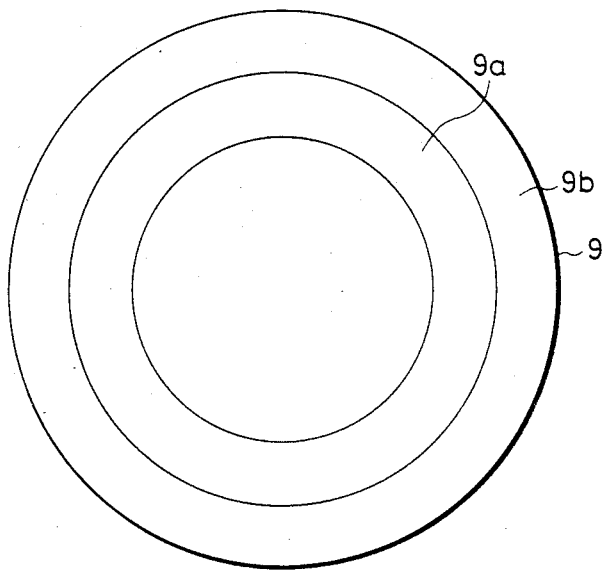
FIG. 2 is a plan view of its support substrate.

The present lithographic mask structure is prepared by the so-called transfer technique, for example, in steps schematically shown in FIG. 3. According to the embodiment shown in FIG. 3, a support film 2 as an X-ray-transmissible layer, a mask member-supporting layer 4 having mask members 3, and a support film 5 acting also as a protective layer are successively provided one upon another on a flat plate 1 to form a mask film member 6 (FIG. 3).

Flat plate 1 is usually a plate having a high degree of flatness made from an inorganic crystal such as quartz, silicon, glass, or ceramic, a metal, such as iron, cobalt, nickel, copper, brass, steel, stainless steel, Fernico, or Invar, or plastics. The shape of flat plate 1 can be selected in view of the shape of a mask structure to be prepared.

Support films 2 and 5 are made from a polymer film by application of a polymer solution of polyimide, polyamide, or polyester, by skinner, dipping, spraying, or squeezing, followed by drying, from an inorganic film by deposition of an inorganic material, such as silicon nitride, boron nitride, silicon dioxide, or silicon carbide, etc., by CVD, etc., or can be a composite film of the polymer film and the inorganic film, and have a thickness of usually about 2 $\mu$m.

Mask members 3 are made of a noble metal and a heavy metal such as gold, platinum, palladium, indium, nickel, or tungsten, and pattern formation is carried out by photolithography or by lithography using X-ray, electron beam, or ion beam. The mask member-supporting layer 4 has a thickness of usually 0.2 to 0.7 $\mu$m.

Figure 3A:
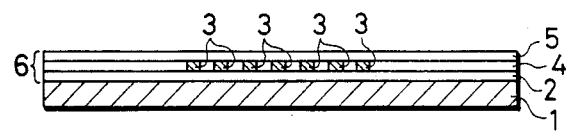
FIGS. 3A–3D are schematic views showing the step flow for preparing a mask according to a first embodiment of the present process for preparing a lithographic mask structure.
Figure 3B:
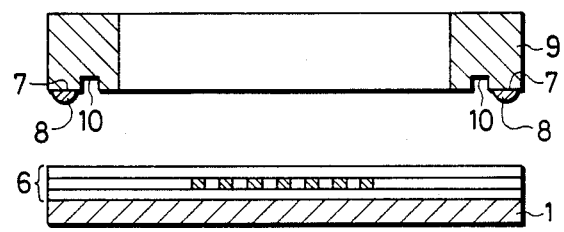

Then, a support substrate 9 having an adhesive 8 on the bonding surface 7 to the mask film member 6 is made to approach from the overhead of the mask film member 6 and come in contact therewith, as shown in FIGS. 3B and C, and the mask film member 6 and the support substrate 9 are bonded to each other by curing the adhesive 8.

Support substrate 9 is, for example, in an annular shape, and is made from an inorganic crystal of quartz, silicon, glass, or ceramic, or a metal such as iron, cobalt, nickel, aluminum, brass, or phosphor bronze. Adhesive 8 may be epoxy-based, emulsion-based, or amine-based, irrespective of heat-curing type, photo-curing type, or solvent-type, and a hydrophobic adhesive having a good heat resistance is preferable.

The present invention is characterized by providing a groove 10 at the bonding position of support substrate 9 shown in FIG. 3 to the mask film member 6, thereby controlling the flow of adhesive 8. That is, the support substrate (9) is provided with an annular groove 10 having a square cross-section on the bonding surface 7 at a position near the inner peripheral side of the annular substrate, whereby the adhesive 8 is prevented from possible overflow toward the inner peripheral side of the annular substrate, as shown in FIG. 3.

Figure 3C:
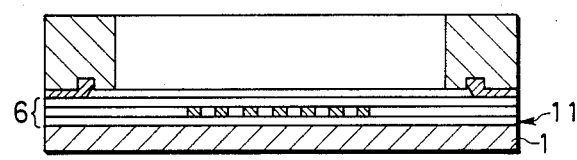
Figure 3D:
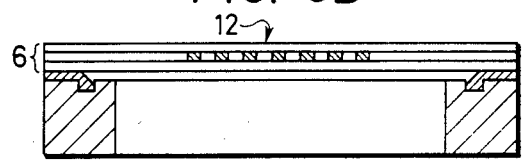
Figure 4:
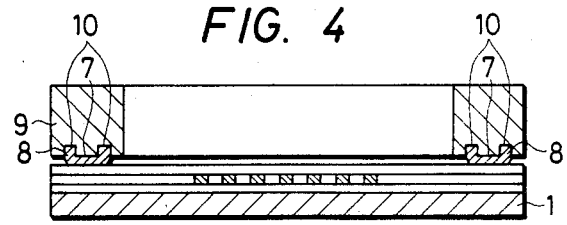
FIG. 4 is a schematic view showing a second embodiment of the present process for preparing a lithographic mask structure, corresponding to FIG. 3C.

In the embodiment shown in FIG. 4, where the same reference numeral as in FIG. 3 are used, the support substrate 9 is provided with two annular grooves 10 and 10 having a square cross-section on the bonding surface 7, that is, at a position near the inner peripheral side of the annular substrate and at a position near the outer peripheral side of the annular substrate, whereby the adhesive 8 is prevented from overflow toward the inner and outer peripheral sides of the annular substrate. The number of grooves is not restricted to 1 or 2, and can be 3 or more. Any shape can be used for the groove, provided that it can control the flow of the adhesive.

According to the embodiment shown in FIG. 3, protruded adhesive etc. from between the support substrate 9 and the mask film member 6 is removed by cutting, if necessary, after the adhesive 8 is thoroughly cured, and then the mask film member 6 and the flat plate 1 are separated off from each other along the contact surface 11 between the mask film member 6 and the flat surface 1 in FIG. 3C by a mechanical means, such as a knife, by decomposition using an ultraviolet ray, by modification, or by ultrasonic wave, to obtain a mask structure 12, as shown in FIG. 3D.

Figure 5:
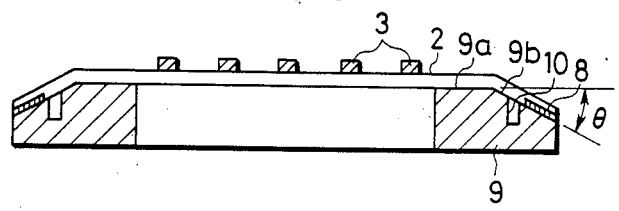
FIGS. 5, 6 and 7 are cross-sectional views according to third, fourth and fifth embodiments, respectively, of the present lithographic mask structures.

FIG. 5 is a cross-sectional view showing a third embodiment of the present lithographic mask structure, where mask members 3 are provided in a desired pattern on one side of support film 2. Mask members 3 are films of, for example, gold, platinum, nickel, palladium, rhodium, or indium, having a thickness of about 0.7 $\mu$m. Support film 2 is an inorganic film of silicon nitride, boron nitride, silicon oxide, or titanium, or an organic film of polyimide, polyamide, or polyester, or a laminate thereof, and has a thickness of, for example, 2 to 3 $\mu$m. The peripheral part of support film 2 is bonded to an annular support substrate 9 at a position lower than the uppermost flat end surface thereof by an adhesive 8 and supported on the support substrate 9. Adhesive 8 is applied not to the uppermost flat end surface 9a of support substrate 9, but to the surface 9a which intersects with the flat end surface 9a at the outer side at an angle $\theta$. The angle $\theta$ is not particularly restricted, so long as it exceeds 0°, but is preferably 5° to 90°, more preferably 5° to 60°, and most preferably 15° to 30°. Support substrate 9 is usually made from silicon, glass, quartz, phosphor bronze, brass, nickel, or stainless steel. Adhesive 8 is, for example, epoxy-based, rubber-based, or the like, and can be also, for example, in a solution type, a thermosetting type, or a photosetting type.

A groove 10 is provided on the bonding surface 9b of support substrate 9, which intersects therewith at the outside of uppermost flat end surface 9a at an angle $\theta$, whereby the adhesive 8 flows into the groove 10 before it extends over the uppermost flat end surface 9a of support substrate 9. Thus, the adhesive 8 never extends over the uppermost flat end surface 9a, and the flatness of support film 2 can be kept better.

An air vent hole which communicates with other space (not shown in the drawings) may be provided in the groove 10.

Figure 6:
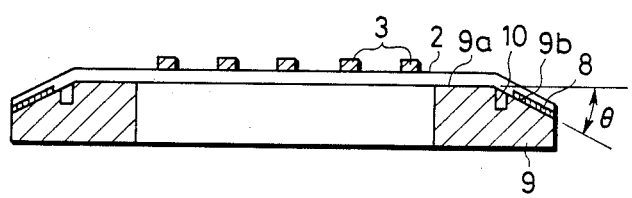

FIG. 6 is a cross-sectional view of a fourth embodiment of the present mask structure, where a groove 10 is provided on the bonding surface 9b at a position near the intersection with the uppermost flat end surface 9a, and thus an adhesive 8 can be prevented from possible extension over the uppermost flat end surface 9a, and also the area of the part to which the adhesive 8 is applied can be increased, whereby the adhesion can be more ensured.

Figure 7:
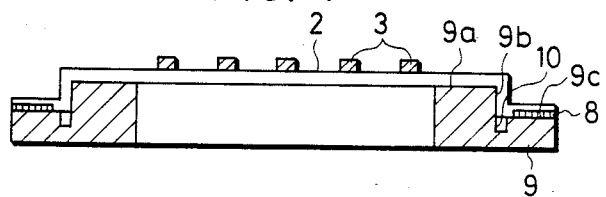

FIG. 7 is a cross-sectional view of a fifth embodiment of the present mask structure, wherein the angle $\theta$ corresponds to 90° and a third surface 9c is formed as the bonding surface. In this embodiment, a groove 10 is provided at a position near the intersection of the bonding surface 9c with the surface 9b, and the flow of adhesive 8 toward the uppermost flat end surface 9a is controlled by the groove 10 to keep the flatness of the support film 2 better and also to increase the area of the part to which the adhesive 8 is applied.

In the foregoing embodiments, there may be protruded parts of support substrate 2 in contact with the support substrate 9 at other surfaces than the uppermost flat end surface 9a according to the three-dimensional shape, and such protruded parts can be removed as desired in advance.

In the foregoing embodiments, the groove is provided at the inner side from the bonding surface of the support substrate to the support film, but can be provided at any position on the bonding surface, so long as it can control the flow of adhesive so that the adhesive may not extend over the uppermost flat end surface of support substrate. Furthermore, the number of groove is not restricted to 1, but can be 2 or more, and any shape of groove can be used, so long as it can control the flow of adhesive. Further, although, in the above embodiment, the lithographic mask structure comprises a mask member provided in a desired pattern on one side of support film, the lithographic mask structure according to the present invention is not limited to the above structure. That is to say, the present invention also includes the structure in which mask support film has not been applied to the mask member or the structure in which although the mask support film is applied to one side of the mask member, the pattern has not been formed on the film.

What we claimed is:

1. A lithographic mask structure comprising:
    a mask support film; and
    a substrate including a central flat top surface and an outer peripheral bonding surface, said peripheral bonding surface being inclined so that a thickness of the substrate decreases in a radial direction and having an annular groove therein, said mask support film being disposed on said substrate so as to cover said flat top surface, and an outer peripheral portion of said mask support film being adhesively bonded to said inclined peripheral bonding surface of said substrate, wherein
    said annular groove prevents adhesive disposed on the said peripheral bonding surface from reaching an interface between said flat top surface and said mask support film.

2. A lithographic mask structure according to claim 1, further comprising a mask member which is applied with a desired pattern to said mask support film.

3. A lithographic mask structure according to claim 1, further comprising a mask member applied as a film to said mask support film.

4. A lithographic mask structure according to claim 1, wherein said groove includes a venting portion through which adhesive can flow out from the groove.

5. A lithographic mask structure according to claim 1, wherein said annular groove is formed at a middle portion in a radial direction of said peripheral bonding surface.

6. A lithographic mask structure according to claim 1, wherein said annular groove is formed along an inner peripheral portion of said peripheral bonding surface adjacent to an outer peripheral portion of said flat top surface.

7. A lithographic mask structure according to claim 5, wherein said mask support film is adhesively bonded to said substrate at a portion located outside of said groove in the radial direction of said peripheral bonding surface.

8. A lithographic mask structure according to claim 6, wherein said mask support film is adhesively bonded to said substrate at a portion located outside of said groove in the radial direction of said peripheral bonding surface.

9. A lithographic mask structure comprising:
    a mask support film; and
    a substrate including a central flat top surface formed at a first level, and an outer peripheral flat bonding surface formed at a second level lower than the first level of said flat top surface so that a thickness of the peripheral surface is smaller than that of said central portion;
    an annular groove formed adjacent to an axial wall adjoining said top surface and said bonding surface, and at an inner peripheral portion of said bonding surface;
    said mask support film being disposed on said substrate so as to cover said flat top surface and having an outer peripheral portion adhesively bonded to said peripheral flat bonding surface of said substrate, wherein
    the adhesive is prevented by said groove from reaching an interface between said flat top surface and said mask support film.

* * * * *

UNITED STATES PATENT AND TRADEMARK OFFICE
CERTIFICATE OF CORRECTION

PATENT NO. : 4,804,600
DATED : February 14, 1989
INVENTOR(S) : Kato, et al.

It is certified that error appears in the above-identified patent and that said Letters Patent is hereby corrected as shown below:

Title page:

[56]     References Cited:

Line 6, "Windeschmann" should read --Windischmann--.

[75]     Inventors:

"Hirofumi Shibatya" should read --Hirofumi Shibata--.

COLUMN 2:

Line 10, "film 2.  As" should read --film 2, as--.

COLUMN 3:

Line 14, delete "etc.," (both occurrences).

Line 49, "numeral" should read --numerals--.

COLUMN 4:

Line 18, "surface 9a" should read --surface 9b--.

UNITED STATES PATENT AND TRADEMARK OFFICE
CERTIFICATE OF CORRECTION

PATENT NO. : 4,804,600  Page 2 of 2
DATED     : February 14, 1989
INVENTOR(S) : Kato, et al.

It is certified that error appears in the above-identified patent and that said Letters Patent is hereby corrected as shown below:

COLUMN 5:

Line 2, "groove" should read --groves--.

Line 18, "What we claimed is:" should read
        --What we claim is:--

COLUMN 6:

Line 2, "said groove" should read --said annular groove--

Signed and Sealed this

Sixteenth Day of October, 1990

Attest:

HARRY F. MANBECK, JR.

*Attesting Officer*  *Commissioner of Patents and Trademarks*